United States Patent
Trubelja et al.

(10) Patent No.: US 10,145,006 B2
(45) Date of Patent: Dec. 4, 2018

(54) PHYSICAL VAPOR DEPOSITION USING ROTATIONAL SPEED SELECTED WITH RESPECT TO DEPOSITION RATE

(71) Applicant: United Technologies Corporation, Farmington, CT (US)

(72) Inventors: Mladen F. Trubelja, Machester, CT (US); David A. Litton, West Hartford, CT (US); Joseph A. DePalma, Feeding Hills, MA (US); James W. Neal, Ellington, CT (US); Michael Maloney, Marlborough, CT (US); Russell A. Beers, Manchester, CT (US); Brian T. Hazel, Avon, CT (US); Glenn A. Cotnoir, Thompson, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 58 days.

(21) Appl. No.: 15/112,213

(22) PCT Filed: Jan. 8, 2015

(86) PCT No.: PCT/US2015/010589
§ 371 (c)(1),
(2) Date: Jul. 18, 2016

(87) PCT Pub. No.: WO2015/108747
PCT Pub. Date: Jul. 23, 2015

(65) Prior Publication Data
US 2016/0333465 A1 Nov. 17, 2016

Related U.S. Application Data

(60) Provisional application No. 61/929,178, filed on Jan. 20, 2015.

(51) Int. Cl.
*C23C 14/54* (2006.01)
*C23C 14/08* (2006.01)
(Continued)

(52) U.S. Cl.
CPC .......... *C23C 14/542* (2013.01); *C23C 14/083* (2013.01); *C23C 14/243* (2013.01);
(Continued)

(58) Field of Classification Search
CPC ................................................ C23C 14/542
(Continued)

(56) References Cited

U.S. PATENT DOCUMENTS

| 5,087,477 A | 2/1992 | Giggins, Jr. et al. |
| 5,350,599 A | 9/1994 | Rigney et al. |

(Continued)

FOREIGN PATENT DOCUMENTS

| EP | 0972853 | 1/2000 |
| WO | 9935306 | 7/1999 |

OTHER PUBLICATIONS

International Preliminary Report on Patentability for PCT Application No. PCT/US2015/010589 dated Aug. 4, 2016.
Supplementary European Search Report for European Patent Application No. 15737817 completed Jan. 6, 2017.
The International Search Report and Written Opinion for PCT Application No. PCT/US2015/010589, dated Apr. 29, 2015.

*Primary Examiner* — Brent T O'Hern
(74) *Attorney, Agent, or Firm* — Carlson, Gaskey & Olds, P.C.

(57) ABSTRACT

A method for use in a physical vapor deposition coating process includes depositing a ceramic coating material from a plume onto at least one substrate to form a ceramic coating thereon, and during the deposition, rotating the at least one substrate at rotational speed selected with respect to deposition rate of the ceramic coating material onto the at least one substrate.

9 Claims, 3 Drawing Sheets

(51) Int. Cl.
   *C23C 14/30*    (2006.01)
   *C23C 14/50*    (2006.01)
   *F01D 15/10*    (2006.01)
   *C23C 14/24*    (2006.01)
   *F01D 9/04*     (2006.01)

(52) U.S. Cl.
   CPC ............ *C23C 14/30* (2013.01); *C23C 14/505* (2013.01); *C23C 14/54* (2013.01); *F01D 9/041* (2013.01); *F01D 15/10* (2013.01); *F05D 2220/32* (2013.01); *F05D 2230/313* (2013.01); *F05D 2230/90* (2013.01); *F05D 2300/2118* (2013.01)

(58) Field of Classification Search
   USPC .......................................................... 428/98
   See application file for complete search history.

(56) References Cited

U.S. PATENT DOCUMENTS

| | | | |
|---|---|---|---|
| 5,856,027 | A | 1/1999 | Murphy |
| 6,180,184 | B1 | 1/2001 | Gray et al. |
| 6,221,512 | B1 | 4/2001 | Rickerby |
| 6,306,517 | B1 | 10/2001 | Gray et al. |
| 7,318,955 | B2 | 1/2008 | Darolia et al. |
| 2003/0180571 | A1* | 9/2003 | Singh .................. C23C 14/083 428/633 |
| 2003/0203127 | A1 | 10/2003 | Bruce et al. |
| 2010/0304037 | A1 | 12/2010 | Zimmerman et al. |
| 2013/0327271 | A1 | 12/2013 | Movchan et al. |

* cited by examiner ically vapor deposition ("PVD"). PVD is one common method for depositing a coating, such as a metallic coating or a ceramic coating, on a substrate. One type of PVD process utilizes an electron beam gun to melt and evaporate a source coating material contained within a crucible. The evaporated source material condenses and deposits onto the substrate.

PHYSICAL VAPOR DEPOSITION USING ROTATIONAL SPEED SELECTED WITH RESPECT TO DEPOSITION RATE

CROSS-REFERENCE TO RELATED APPLICATION

This application claims priority to U.S. Provisional Application No. 61/929,178, filed Jan. 20, 2014.

BACKGROUND

This disclosure relates to physical vapor deposition ("PVD"). PVD is one common method for depositing a coating, such as a metallic coating or a ceramic coating, on a substrate. One type of PVD process utilizes an electron beam gun to melt and evaporate a source coating material contained within a crucible. The evaporated source material condenses and deposits onto the substrate.

SUMMARY

A method for use in a physical vapor deposition coating process according to an example of the present disclosure includes depositing a ceramic coating material from a plume onto at least one substrate to form a ceramic coating thereon. During the deposition, rotating the at least one substrate at a rotational speed selected with respect to deposition rate of the ceramic coating material onto the at least one substrate.

A further embodiment of any of the foregoing embodiments include rotating the at least one substrate at the rotational speed selected with respect to deposition rate and also with respect to a resulting durability of the ceramic coating material.

In a further embodiment of any of the foregoing embodiments, the deposited ceramic coating has segmented columns extending outwardly from the at least one substrate, and including selecting the rotational speed with respect to deposition rate such that segments of the segmented columns have a thickness of 0.1-0.75 micrometers.

In a further embodiment of any of the foregoing embodiments, the deposited ceramic coating has segmented columns extending outwardly from the at least one substrate, and including selecting the rotational speed with respect to deposition rate such that segments of the segmented columns have a thickness of 0.3-0.5 micrometers.

In a further embodiment of any of the foregoing embodiments, the rotational speed is 12-120 revolutions per minute.

In a further embodiment of any of the foregoing embodiments, the rotational speed is 30-60 revolutions per minute.

In a further embodiment of any of the foregoing embodiments, the ceramic coating material is a zirconia-based material.

In a further embodiment of any of the foregoing embodiments, the at least one substrate includes an alumina scale, and the depositing includes depositing the ceramic coating material onto a surface of the alumina scale.

In a further embodiment of any of the foregoing embodiments, the deposited ceramic coating has a columnar microstructure with columns extending outwardly from the at least one substrate.

A further embodiment of any of the foregoing embodiments includes depositing the ceramic coating material in a chamber at an internal pressure in the chamber of $5 \times 10^{-4}$-$3 \times 10^{-1}$ torr (0.067-40 pascals).

An apparatus for use in a physical vapor deposition coating process according to an example of the present disclosure includes a chamber, a crucible configured to hold a ceramic coating material in the chamber, an energy source operable to heat the interior of the chamber, a fixture for holding at least one substrate in the chamber, an actuator operable to rotate the fixture, and a controller. The controller is configured to establish a plume of the ceramic coating material in the chamber to deposit the ceramic coating material from the plume onto the at least one substrate and form a ceramic coating thereon, and during the deposition, rotate the at least one substrate at a rotational speed selected with respect to deposition rate of the ceramic coating material onto the at least one substrate.

In a further embodiment of any of the foregoing embodiments, the rotational speed is 12-120 revolutions per minute.

In a further embodiment of any of the foregoing embodiments, the rotational speed is 30-60 revolutions per minute.

In a further embodiment of any of the foregoing embodiments, the ceramic coating material is a zirconia-based material.

A coated article comprising according to an example of the present disclosure includes a substrate, and a ceramic coating on the substrate. The ceramic coating has a columnar microstructure with segmented columns having a thickness of 0.1-0.75 micrometers.

In a further embodiment of any of the foregoing embodiments, the segmented columns have a thickness of 0.3-0.5 micrometers.

In a further embodiment of any of the foregoing embodiments, at least a majority of the segmented columns have a uniform width.

In a further embodiment of any of the foregoing embodiments, at least a majority of the segmented columns are unbranched along at least half the total thickness of the ceramic coating distal from the substrate.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
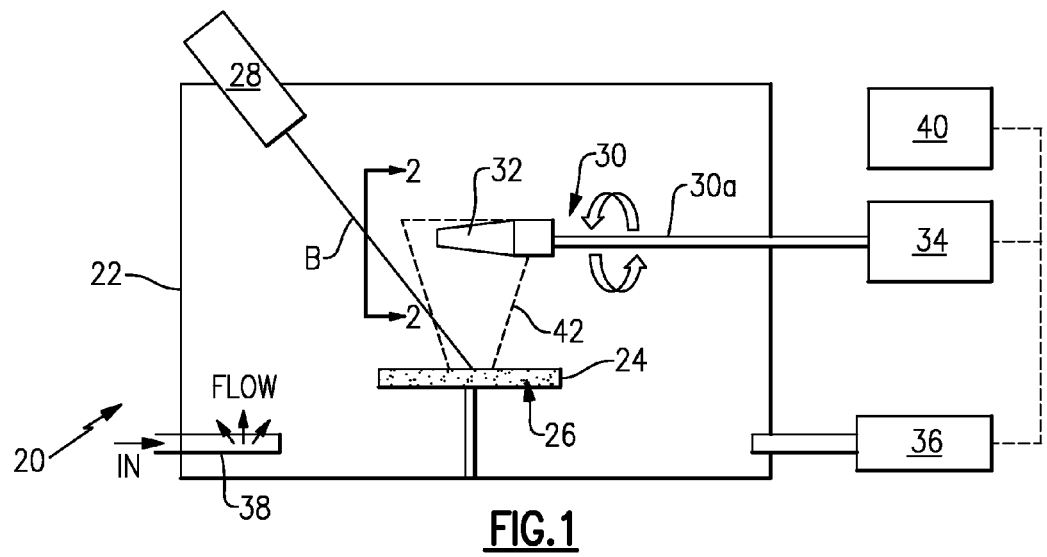
FIG. 1 illustrates an example coating apparatus.

FIG. 1 schematically illustrates an example apparatus 20 for use in a physical vapor deposition ("PVD") coating process, which will also be described with reference to the apparatus 20. The examples herein may be described with reference to the deposition of a ceramic coating onto a substrate, such as, but not limited to, gas turbine engine airfoils or airfoil multiplets of a plurality of airfoil vanes. It is to be understood, however, that the examples may also be applied to other coatings, other gas turbine engine components, and non-engine components.

The apparatus 20 in the illustrated example includes a chamber 22 and a crucible 24 that is configured to hold a coating material 26 in the chamber 22. For example, the crucible 24 can be a tray that holds particulate of the coating material 26. Alternatively, the crucible 24 can be adapted to hold and present an ingot of the coating material 26.

The apparatus 20 further includes an energy source 28 that is operable to heat and vaporize the coating material 26. In one example, the energy source 28 includes one or more electron beam guns that are operable to emit electron beams, represented at B, onto the coating material 26.

The apparatus 20 also includes a fixture 30 for holding at least one substrate 32 in the chamber 22. In this example, the fixture 30 includes a shaft 30a that is connected to an actuator 34. The actuator 34 is operable to rotate the shaft 30a, and to thus also rotate the substrate 32.

Figure 2:
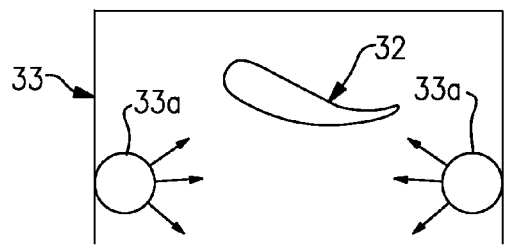
FIG. 2 illustrates another view of a portion of the example coating apparatus of FIG. 1 according to the view direction indicated in FIG. 1.

FIG. 2 illustrates schematically a view of a portion of the apparatus 20 according to the section line in FIG. 1. In this example, the apparatus 20 includes a thermal hood 33, sometimes referred to as coater box. The walls of the thermal hood 33 extend partially around the substrate 32 and accommodate one or more gas manifolds 33a. The gas manifold(s) 33a is/are connected to one or more gas sources, such as an oxygen-containing gas, which can be pure, or substantially pure, oxygen. Arrows emanating from gas manifold(s) 33a schematically illustrate the direction of the gas flow.

Referring again to FIG. 1, the apparatus 20 further includes a vacuum pump 36 that is operable to reduce the pressure inside of the chamber 22 and one or more additional gas manifolds 38 that can be connected to the same or different gas source (not shown) for providing process gas into the interior of the chamber 22. For example, the process gas can include oxygen, helium, neon, argon, krypton, xenon, or mixtures thereof. It is to be appreciated that this disclosure is not limited to the example configuration of the apparatus 20.

A controller 40 is operably connected with at least the actuator 34 and the vacuum pump 36, and also optionally the gas manifolds 33a/38, to control rotation of the substrate 32 as well as gas flow and pressure within the chamber 22 during coating deposition. The controller 40 can include hardware, such as a microprocessor, software, or a combination thereof, that is configured to carry out the functions disclosed herein, individually or in any combination, and generally control operation of the apparatus 20.

In this example, the apparatus 20 and controller 40 are configured for a method of physical vapor deposition. For example, the method can include depositing the ceramic coating material 26 from a plume 42 onto the substrate 32 to form a ceramic coating thereon. Further, during the deposition, the controller 40 controls rotation of the substrate 32 and provides for rotation at a rotational speed selected with respect to deposition rate of the ceramic coating material 26 onto the at substrate 32. In further examples, the method may also include depositing at an internal pressure in the chamber 22 of $5 \times 10^{-4}$-$3 \times 10^{-1}$ torr (0.067-40 pascals).

The controller 40 commands the actuator 34 to rotate the fixture 30, and thus the substrate 32, at a rotational speed that is selected with respect to deposition rate. One indicator of deposition rate can be coating flux per unit area, with units of weight per unit area. In the examples herein, coating flux is maintained to be constant or substantially constant during coating deposition. The selection of rotational speed with respect to deposition rate can be used to control, and improve, durability of the ceramic coating deposited at a given internal chamber pressure.

Durability can be evaluated by testing a durability parameter of one or more samples. Additionally, testing results can be used to estimate, at least qualitatively, the durability of one or more untested coatings, through microstructural analysis, for example. An example durability parameter useful for gas turbine engine components is spallation resistance in thermal cycling conditions, such as conditions found in, or that simulate, gas turbine engines. For example, for ceramic coatings deposited by physical vapor deposition as disclosed herein, durability, and the potential improvement thereof, can refer to spallation resistance in thermal cycling conditions for components or samples having a material difference in coefficient of thermal expansion ("CTE") between the substrate 32 and a ceramic coating 54 deposited thereon (see FIG. 3). In one further example, durability refers to spallation resistance in thermal cycling conditions with a given difference in CTE between a nickel-based superalloy substrate 32 and a stabilized zirconia ceramic coating 54. As a further example, nickel-based superalloy can have a CTE of approximately 14 microinch/inch °C., and stabilized zirconia can have a CTE of approximately 9 microinch/inch °C. These values can vary in dependence on specific composition by approximately 10-15%. Thus, the present disclosure can be applied to control durability with respect to such nickel-based superalloy substrates and stabilized zirconia ceramic coatings, for example.

In one example, the rotational speed used during deposition can be as low as 12 revolutions per minute, and as high as 120 revolutions per minute. In further examples, the rotational speed is 30 revolutions per minute or greater, or 30 to 60 revolutions per minute.

In a further example, the coating material 26 is a zirconia-based material. Example zirconia-based materials can include yttria-stabilized zirconia and gadolinia-stabilized zirconia, but are not limited to these zirconia-based materials.

Figure 3:
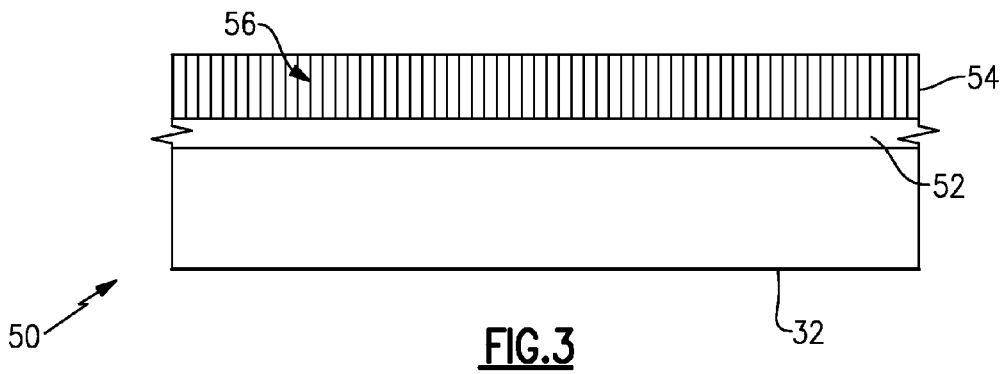
FIG. 3 illustrates an example article produced using the apparatus.

FIG. 3 illustrates a representative portion of an example article 50 produced using the apparatus 20 and method described above. In this example, the substrate 32 includes an alumina scale 52 that was grown or prepared in a known manner prior to and/or during the deposition process. The ceramic coating is shown at 54 and has been deposited onto the top surface of the alumina scale 52. The ceramic coating 54 has a columnar microstructure 56 with columns that extend outwardly from the substrate 32.

During deposition, due to rotation of the substrate 32, the ceramic coating 54 deposits in sublayers. That is, for each rotation of the substrate 32, a single sublayer is deposited. When sectioned and polished for microstructural analysis, these sublayers are microstructurally distinguishable at magnification. The sublayers manifest as segments in the columnar microstructure 56. The thickness of the sublayers, or segments, in the vertical or substantially vertical direction from the substrate 32 can be used to assess the durability of a microstructure of a ceramic coating, and with a view to selecting rotational speed with respect to deposition rate to control durability of a deposited ceramic coating.

As a general example, all else being equal, such as coating composition, temperature, pressure and deposition rate, relatively slow substrate rotation will result in thicker segments and relatively fast substrate rotation will result in thinner segments. Thus, for a given target coating thickness (overall thickness), a coating deposited at relatively slow substrate rotation will contain fewer segments in the vertical direction than a coating deposited at relatively fast substrate rotation. However, by comparison, coating processes typically focus on temperature control as a main control parameter with respect to durability, without regard to rotation speed and deposition rate. However, by selecting rotation speed with respect to deposition rate, the thickness of the segments can be controlled to, in turn, control durability. For example, the durability refers to spallation resistance in thermal cycling conditions with a given material difference in CTE between the substrate 32 and the ceramic coating 54, as discussed herein above.

In a further example, the selection of rotation speed with respect to deposition rate, and the resulting influence on durability, can be even more pronounced when using relatively low vacuum internal chamber pressures during deposition. For example, low vacuum internal chamber pressures can be deposition pressures in the range of $5 \times 10^{-4}$ torr to $3 \times 10^{-1}$ torr.

Deposition in a low vacuum internal chamber pressure range results in relatively high deposition rate of a ceramic coating material. Thus, rotation speeds that may yield good durability results at one pressure, may not yield good durability results at another, different pressure. For example, an increase in pressure from a given high vacuum internal chamber pressure to a given low vacuum internal chamber pressure by a factor of about 200 results in a higher deposition rate by a factor of about 4. At such high deposition rates, considerably thicker segments within the ceramic columns will be deposited, which reduces coating durability.

Figure 4:
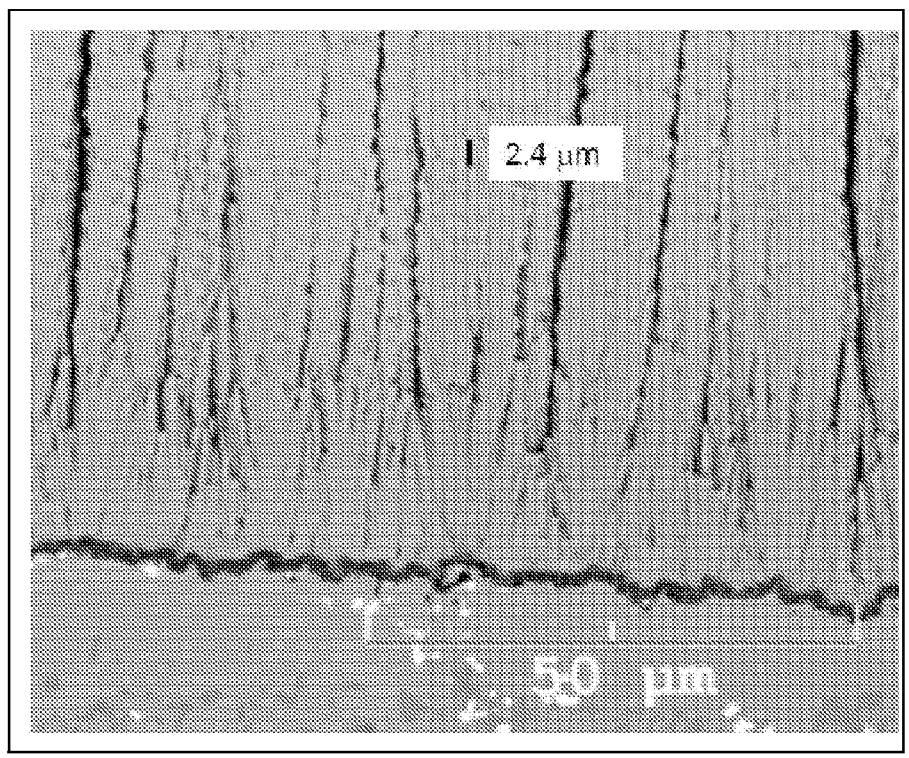
FIG. 4 illustrates an image of a polished cross-section of a ceramic coating deposited at a rotational speed of 12 revolutions per minute in a low vacuum internal chamber pressure of 0.1 torr (13.4 pascals).

FIG. 4 shows an image of a polished cross-section of a ceramic coating deposited at a rotational speed of 12 revolutions per minute in a low vacuum internal chamber pressure of 0.1 torr (13.4 pascals). The coating has a columnar microstructure (columns extending vertically in the image) with distinct deposition boundaries running substantially horizontally and defining column segments. In this example, the column segments are approximately 2.4 micrometers in thickness, in the vertical direction from the substrate at the bottom of the image. The coating of FIG. 4 has a relatively low durability as a result of relatively low adherence between the segments, which reduces spallation resistance and strain tolerance of the coating as a whole. In addition, the gaps between the columns are relatively narrow, which can also contribute to reducing strain tolerance and spallation resistance.

Figure 5:
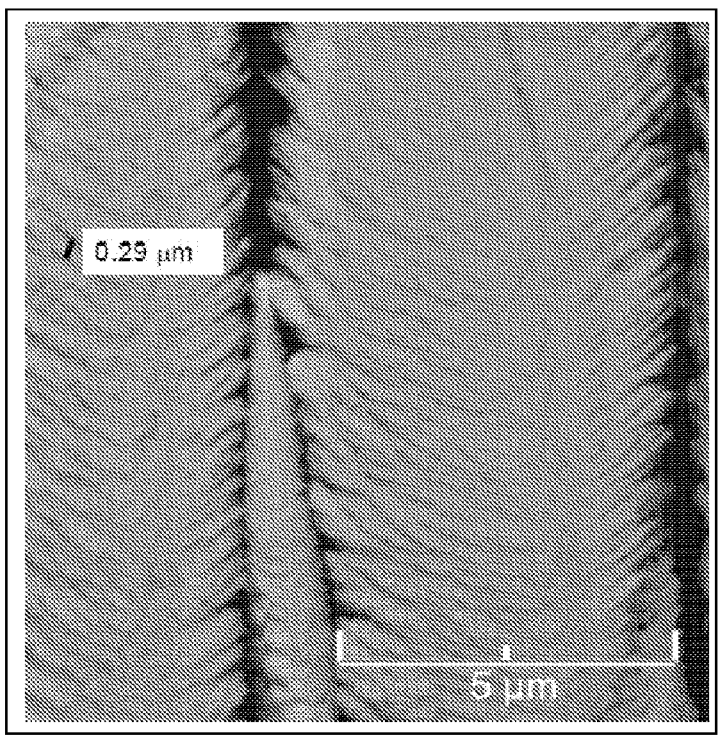
FIG. 5 illustrates an image of a polished cross-section of a ceramic coating deposited at a rotational speed of 60 revolutions per minute in a low vacuum internal chamber pressure of 0.075 torr (10 pascals).

As a comparison, FIG. 5 shows a higher magnification image of a polished cross-section of a ceramic coating deposited at a rotational speed of 60 revolutions per minute in a low vacuum internal chamber pressure of 0.075 torr (10 pascals). In this example, the coating also has a columnar microstructure (columns extending vertically in the image) with distinct deposition boundaries running substantially horizontally and defining column segments. In this example, the column segments are approximately 0.29 micrometers in thickness, in the vertical direction from the substrate at the bottom of the image. The coating of FIG. 5 has a relatively high durability as a result of good adherence between the segments, which increases spallation resistance and strain tolerance of the coating as a whole. The microstructure of the coating in FIG. 5 is thus more favorable with respect to durability than the microstructure of the coating of FIG. 4. In addition, the gaps between the columns are wider relative to the columnar gaps of the coating in FIG. 4, which can also contribute to, comparatively, increasing strain tolerance and spallation resistance. In further examples, the rotational speed can be selected with respect to deposition rate to provide a segment thickness of 0.1-0.75 micrometers to obtain good durability of a deposited ceramic coating, such as a zirconia-based ceramic coating.

Figure 6:
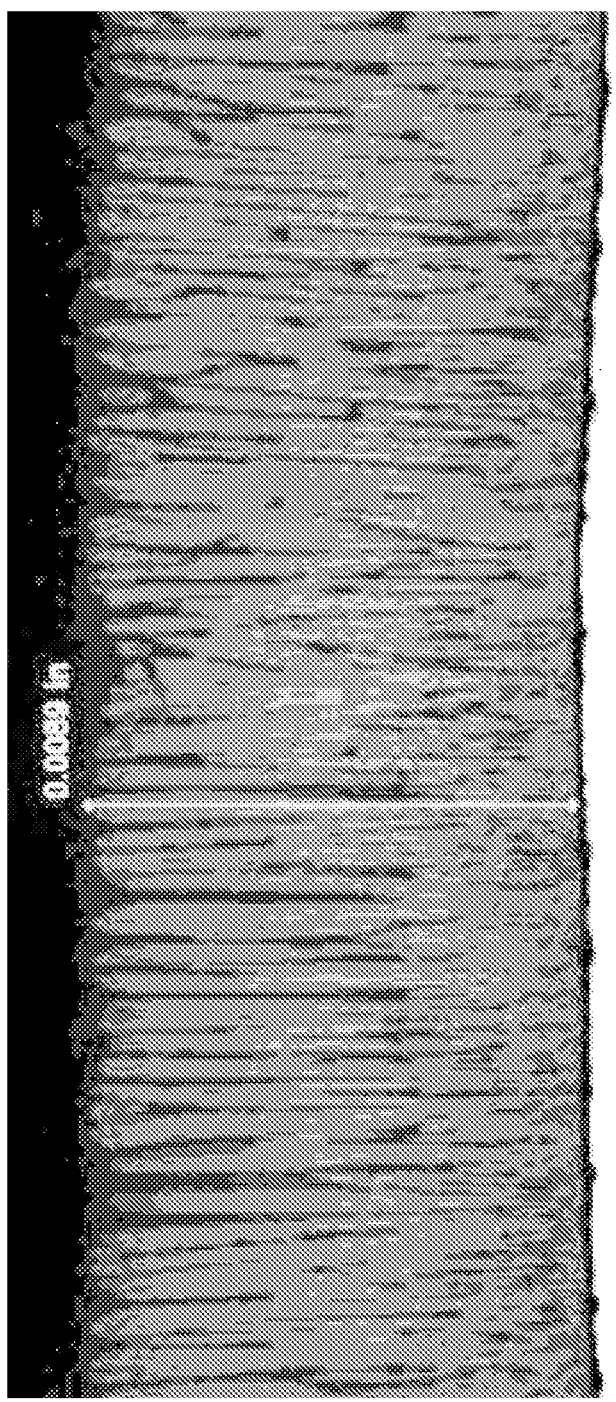
FIG. 6 illustrates an image of a polished cross-section of an yttria-stabilized zirconia coating deposited at 60 revolutions per minute under a chamber pressure of 0.075 torr (10 pascals).

FIG. 6 illustrates another example image of a polished cross-section of a ceramic coating produced according to this disclosure. In this example, the ceramic coating is an yttria-stabilized zirconia coating deposited at 60 revolutions per minute under a chamber pressure of 0.075 torr (10 pascals). In this example, at least a majority of the columns of the columnar microstructure have a uniform width. Additionally, at least a majority of the columns are unbranched along at least half of the thickness of the ceramic coating that is distal from the substrate, which is at the bottom of the image.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A method for use in a physical vapor deposition coating process, the method comprising:
    depositing a ceramic coating material from a plume onto at least one substrate to form a ceramic coating thereon; and
    during the deposition, rotating the at least one substrate at a rotational speed selected with respect to deposition rate of the ceramic coating material onto the at least one substrate, wherein the rotational speed is 12-120 revolutions per minute.

2. The method as recited in claim 1, including rotating the at least one substrate at the rotational speed selected with respect to deposition rate and also with respect to a resulting durability of the ceramic coating material.

3. The method as recited in claim 1, wherein the deposited ceramic coating has segmented columns extending outwardly from the at least one substrate, and including selecting the rotational speed with respect to deposition rate such that segments of the segmented columns have a thickness of 0.1-0.75 micrometers.

4. The method as recited in claim 1, wherein the deposited ceramic coating has segmented columns extending outwardly from the at least one substrate, and including selecting the rotational speed with respect to deposition rate such that segments of the segmented columns have a thickness of 0.3-0.5 micrometers.

5. The method as recited in claim 1, wherein the rotational speed is 30-60 revolutions per minute.

6. The method as recited in claim 1, wherein the ceramic coating material is a zirconia-based material.

7. The method as recited in claim 1, wherein the at least one substrate includes an alumina scale, and the depositing includes depositing the ceramic coating material onto a surface of the alumina scale.

8. The method as recited in claim 1, wherein the deposited ceramic coating has a columnar microstructure with columns extending outwardly from the at least one substrate.

9. The method as recited in claim 1, including depositing the ceramic coating material in a chamber at an internal pressure in the chamber of $5 \times 10^{-4}$-$3 \times 10^{-1}$ torr (0.067-40 pascals).

* * * * *